United States Patent
Makino (10) Patent No.: US 9,230,503 B2
(45) Date of Patent: Jan. 5, 2016

(54) DRIVE SYSTEM, A DRIVER APPARATUS AND A SIGNAL PROCESSING METHOD FOR DRIVING A DEVICE

(75) Inventor: Jun Makino, Singapore (SG)

(73) Assignee: Creative Technology Ltd, Singapore (SG)

( * ) Notice: Subject to any disclaimer, the term of this patent is extended or adjusted under 35 U.S.C. 154(b) by 14 days.

(21) Appl. No.: 14/236,186

(22) PCT Filed: Jul. 20, 2012

(86) PCT No.: PCT/SG2012/000260
§ 371 (c)(1),
(2), (4) Date: Jan. 30, 2014

(87) PCT Pub. No.: WO2013/019159
PCT Pub. Date: Feb. 7, 2013

(65) Prior Publication Data
US 2014/0160108 A1    Jun. 12, 2014

(30) Foreign Application Priority Data
Aug. 2, 2011 (SG) .................................. 201105546

(51) Int. Cl.
G09G 5/00 (2006.01)
H04N 13/04 (2006.01)
G09G 3/00 (2006.01)
H03K 3/033 (2006.01)

(52) U.S. Cl.
CPC .................. *G09G 5/00* (2013.01); *G09G 3/003* (2013.01); *H04N 13/0438* (2013.01); *H04N 13/0497* (2013.01); *G09G 2310/0264* (2013.01); *H03K 3/033* (2013.01); *H04N 2213/001* (2013.01); *H04N 2213/008* (2013.01)

(58) Field of Classification Search
CPC . G09G 5/00; G09G 3/003; G09G 2310/0264; H04N 13/0429; H04N 13/0436; H04N 13/0438; H04N 13/044; H04N 13/0497; H04N 2213/008; H04N 2213/001; H04N 2213/006; H03K 3/033; G02B 27/2264
USPC ......... 345/7, 8, 9; 348/51, E13.027, E13.036, 348/E13.039, E13.04, E13.041, E13.07
See application file for complete search history.

(56) References Cited

U.S. PATENT DOCUMENTS

| 3,792,200 A * | 2/1974 | Altenburger et al. ......... 307/115 |
| 7,184,099 B1 | 2/2007 | Hojabri |
| 2012/0019639 A1 * | 1/2012 | Chang et al. .................... 348/56 |

* cited by examiner

*Primary Examiner* — Tom Sheng
(74) *Attorney, Agent, or Firm* — Russell Swerdon; Desmund Gean (57) ABSTRACT

A driver apparatus configurable for receiving and processing at least one input signal. The driver apparatus can be coupled to ground potential. The driver apparatus can include a processing portion, a ground potential coupler and a control portion. The processing portion can be configured for receiving and processing the at least one input signal in a manner so as to produce drive signals. The ground potential coupler can couple at least a portion of the processing portion to the ground potential such that the processing portion can be configured to produce the drive signals based on an effective reference potential. The control portion can be coupled to the processing portion and the ground potential coupler. Additionally, the control portion can be configured to receive and process at least a portion of the drive signals in a manner so as to control variance of the effective reference potential.

12 Claims, 9 Drawing Sheets

DRIVE SYSTEM, A DRIVER APPARATUS AND A SIGNAL PROCESSING METHOD FOR DRIVING A DEVICE

FIELD OF INVENTION

The present disclosure generally relates to signal processing. More particularly, various embodiments of the disclosure relate to a drive system, a driver apparatus and a signal processing method for producing drive signals suitable for driving a device.

BACKGROUND 3 dimensional (3D) display systems generally require presentation of separate images for left eye viewing and right eye viewing. In order to do so, the display of a 3D display system presents left images for left eye viewing and right images for right eye viewing in an alternating sequence.

Additionally, for a viewer to view the left images and right images in the aforementioned alternating sequence, a pair of liquid crystal display (LCD) shutter glasses can be provided. A pair of LCD shutter glasses can have a left portion for left eye viewing and a right portion for right eye viewing. A pair of LCD shutter glasses can be configured in a manner such that the left and right portions are alternatively darkened in accordance with the aforementioned alternating sequence.

Thus, the left portion can be darkened when right images are presented on the display of the 3D display system and the right portion can be darkened when the left images are presented on the display of the 3D display system. In this manner, the left eye and right eye of the viewer see only the respective left images and right images on the display of the 3D display system.

Conventional techniques associated with the implementation of such LCD shutter glasses include the use of complementary metal oxide semiconductor (CMOS) based integrated circuits (IC) for the design of a circuit to drive LCD shutter glasses in a manner so as to facilitate the alternative darkening of the left and right portions.

However, it is appreciable that with the use of CMOS based IC may inhibit flexibility in the manner in which the circuit for driving a pair of LCD shutter glasses can be designed. As such, a circuit designed with the use of CMOS based ICs may not facilitate driving of a pair of LCD shutter glasses in a suitably efficient manner.

It is therefore desirable to provide a solution to address at least one of the foregoing problems of conventional techniques.

SUMMARY OF THE INVENTION

In accordance with an aspect of the disclosure, a driver apparatus configurable for receiving and processing at least one input signal is provided. The driver apparatus can be coupled to ground potential. The driver apparatus can include a processing portion, a ground potential coupler and a control portion.

The processing portion can be configured for receiving and processing the at least one input signal in a manner so as to produce drive signals.

The ground potential coupler can couple at least a portion of the processing portion to the ground potential such that the processing portion can be configured to produce the drive signals based on an effective reference potential.

The control portion can be coupled to the processing portion and the ground potential coupler. Additionally, the control portion can be configured to receive and process at least a portion of the drive signals in a manner so as to control variance of the effective reference potential.

BRIEF DESCRIPTION OF THE DRAWINGS

Embodiments of the disclosure are described hereinafter with reference to the following drawings, in which.

DETAILED DESCRIPTION

Representative embodiments of the disclosure, for addressing one or more of the foregoing problems associated with conventional techniques, are described hereinafter with reference to FIG. 1 to FIG. 4.

Figure 1A:
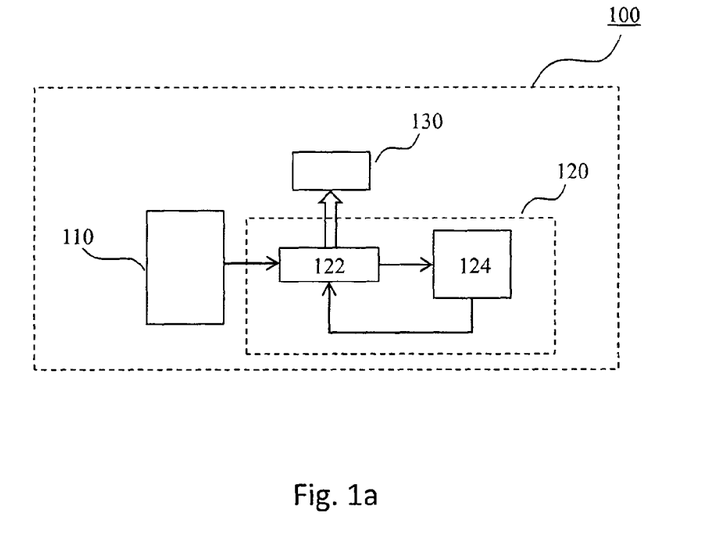
FIG. 1a shows a drive system which includes an input portion, a driver apparatus which includes a processing portion and a control portion, and a device, according to an embodiment of the disclosure.

A drive system 100, in accordance with an embodiment of the disclosure, is shown in FIG. 1a. The drive system 100 includes an input portion 110 and a driver apparatus 120. The input portion 110 is coupled to the driver apparatus 120. The drive system 100 further includes a device 130 coupled to the driver apparatus 120. The driver apparatus 120 can include a processing portion 122 and a control portion 124. The processing portion 122 is coupled to the control portion 124.

More specifically, the processing portion 122 can be coupled to each of the input portion 110 and the device 130. The input portion 110 can be configured to one of receive and produce one or more input signals which can be communicated to the processing portion 122 to produce drive signals. Particularly, the input portion 110 can be, for example, either a signal source for producing one or more input signals or an input port for receiving one or more input signals from a signal source.

Based on the one or more input signals, drive signals can be produced by the processing portion 122 in a manner which will be discussed in further detail with reference to FIG. 1b. The drive signals can be communicated to the device 130 to, for example, drive the device 130. The device 130 can, for example, be a pair of liquid crystal display (LCD) shutter glasses having a left viewing portion and a right viewing portion.

Additionally, at least a portion of the drive signals can be further communicated to the control portion 124 for further processing in a manner, as will be further discussed with reference to FIG. 1b. Based on the at least a portion of the drive signals received and processed by the control portion 124, the processing portion 122 can be controlled in a manner as will be further discussed with reference to FIG. 1b.

The drive system 100 is shown hereinafter in further detail with reference to FIG. 1b. More specifically, the driver apparatus 120 and the device 130 are shown in further detail. Additionally, the driver apparatus 120 can, for example, be an integrated circuit (IC) chip.

Figure 1B:
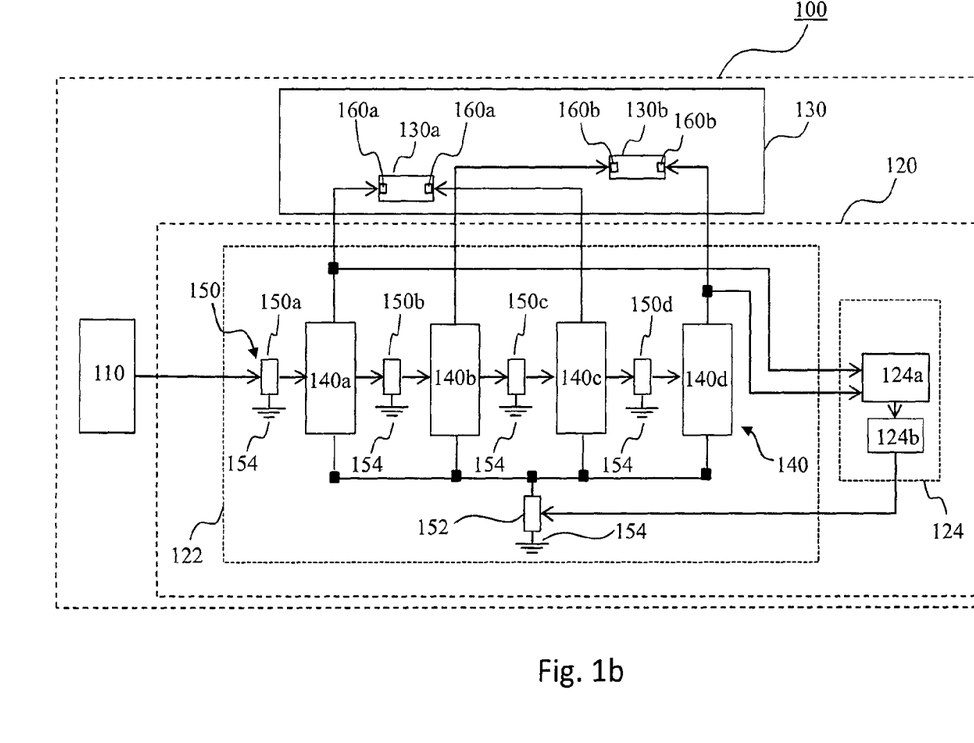
FIG. 1b shows the drive system of FIG. 1a in further detail, according to an embodiment of the disclosure.

Referring to FIG. 1b, the processing portion 122 of the driver apparatus 120 includes a processing segment array 140 and a coupler array 150. The processing portion 122 can further include a ground potential coupler 152. Additionally, the driver apparatus 120 can be coupled to ground potential 154.

The ground potential 154 can be a reference potential based on which the processing portion 122 can be configured to produce the drive signals. Appreciably, when the processing portion 122 is coupled to ground potential 154 via the ground potential coupler 152, the processing portion 122 can be configured to produce the drive signals based on an effective reference potential. Thus the effective reference potential can be a variance of the reference potential and the variance can be associated with the ground potential coupler 152.

In one embodiment, the processing portion 122 can be coupled to ground potential 154 via the ground potential coupler 152. In another embodiment, the processing portion 122 can be coupled directly to ground potential 154. In yet another embodiment, a portion of the processing portion 122 can be coupled to ground potential 154 via the ground potential coupler 152 whereas another portion of the processing portion 122 can be directly coupled to ground potential 154. For example, as shown, the processing segment array 140 can be coupled to the ground potential 154 via the ground potential coupler 152 whereas the coupler array 150 can be coupled to the ground potential 154 directly.

The processing segment array 140 includes a plurality of processing segments and the coupler array 150 includes a plurality of coupler segments. For example, the processing segment array 140 can include a first processing segment 140a, a second processing segment 140b, a third processing segment 140c and a fourth processing segment 140d. Additionally, the coupler array 150 can, for example, include a first coupler segment 150a, a second coupler segment 150b, a third coupler segment 150c and a fourth coupler segment 150d.

The first, second, third and fourth processing segments 140a/140b/140c/140d can be configured to produce a first drive signal, a second drive signal, a third drive signal and a fourth drive signal respectively.

The first processing segment 140a can be coupled to the input portion 110 via the first coupler segment 150a. More specifically, the input portion 110 can be coupled to the first coupler segment 150a which can be coupled to the first processing segment 140a. Therefore one or more input signals communicated from the input portion 110 can be received and processed by the first coupler segment 150a in a manner so as to produce corresponding one or more processed input signals. A processed input signal can be communicated from the first coupler segment 150a to the first processing segment 140a which can be configured to receive and process the processed input signal in a manner so as to produce the first drive signal. The first drive signal can be communicated from the first processing segment 140a.

The second processing segment 140b can be coupled to the first processing segment 140a via the second coupler segment 150b. More specifically, the first processing segment 140a can be coupled to the second coupler segment 150b which can be coupled to the second processing segment 140b. Therefore the first drive signal communicated from the first processing segment 140a can be received and processed by the second coupler segment 150b in a manner so as to produce a processed first drive signal. The processed first drive signal can be communicated from the second coupler segment 150b to the second processing segment 140b which can be configured to receive and process the processed first drive signal in a manner so as to produce the second drive signal. The second drive signal can be communicated from the second processing segment 140b.

The third processing segment 140c can be coupled to the second processing segment 140b via the third coupler segment 150c. More specifically, the second processing segment 140b can be coupled to the third coupler segment 150c which can be coupled to the third processing segment 140c. Therefore the second drive signal communicated from the second processing segment 140b can be received and processed by the third coupler segment 150c in a manner so as to produce a processed second drive signal. The processed second drive signal can be communicated from the third coupler segment 150c to the third processing segment 140c which can be configured to receive and process the processed second drive signal in a manner so as to produce a third drive signal. The third drive signal can be communicated from the third processing segment 140c.

The fourth processing segment 140d can be coupled to the third processing segment 140c via the fourth coupler segment 150d. More specifically, the third processing segment 140c can be coupled to the fourth coupler segment 150d which can be coupled to the fourth processing segment 140d. Therefore the third drive signal communicated from the third processing segment 140c can be received and processed by the fourth coupler segment 150d in a manner so as to produce a processed third drive signal. The processed third drive signal can be communicated from the fourth coupler segment 150d to the fourth processing segment 140d which can be configured to receive and process the processed third drive signal in a manner so as to produce the fourth drive signal. The fourth drive signal can be communicated from the fourth processing segment 140d.

Furthermore, the first, second, third and fourth drive signals can be communicated to the device 130 from the first, second, third and fourth processing segments 140a/140b/140c/140d respectively.

Referring further to FIG. 1b, the control portion 124 can include a detection portion 124a and an output portion 124b. The detection portion 124a can be coupled to the output portion 124b.

Earlier mentioned, at least a portion of the drive signals can be communicated to the control portion 124 for further processing.

In this regard, the detection portion 124a can be coupled to the processing portion 122 in a manner so as to receive a portion of the drive signals. For example, the detection portion 124a can be coupled to the first and fourth processing segments 140a/140d in a manner so as to receive the first and fourth drive signals. The first and fourth drive signals can be processed by the detection portion 124a in a manner so as to produce a control signal. The control signal can be communicated to the output portion 124b.

Based on the control signal, the output portion 124b can be configured to control variance of the effective reference potential with respect to the reference potential in a manner, which will be further discussed with reference to FIG. 2, so as to control the manner in which the processing portion 122 produces the drive signals.

Referring yet further to FIG. 1b, the device 130 can, for example, include a first channel 130a and a second channel 130b corresponding respectively to, for example, the aforementioned left and right portions of the LCD shutter glasses.

The first and second channels 130a/130b can include a first set of input ports 160a and a second set of input ports 160b respectively.

The first and second channels 130a/130b can be coupled to the processing portion 122 in a manner so as to receive drive signals therefrom. Specifically, the first and second channels 130a/130b can be coupled to the processing portion 122 via the first and second set of input ports 160a/160b respectively in a manner so that each of the first and second channels 130a/130b can receive a portion of the driving signals.

The portion of the driving signals received by the first channel 130a can be based upon to produce a first composite driving signal for driving the first channel 130a. The portion of the driving signals received by the second channel 130b can be based upon to produce a second composite driving signal for driving the second channel 130b. For example, the portion of driving signals received by the first channel 130a can include the first and third drive signals, and the portion of driving signals received by the second channel 130b can include the second and fourth drive signals. In this regard, the first composite driving signal can be based on the first and third drive signals, and the second composite driving signal can be based on the second and fourth drive signals, as will be discussed in further detail with respect to an exemplary operation of the drive system 100, with reference to FIG. 3.

Figure 2A:
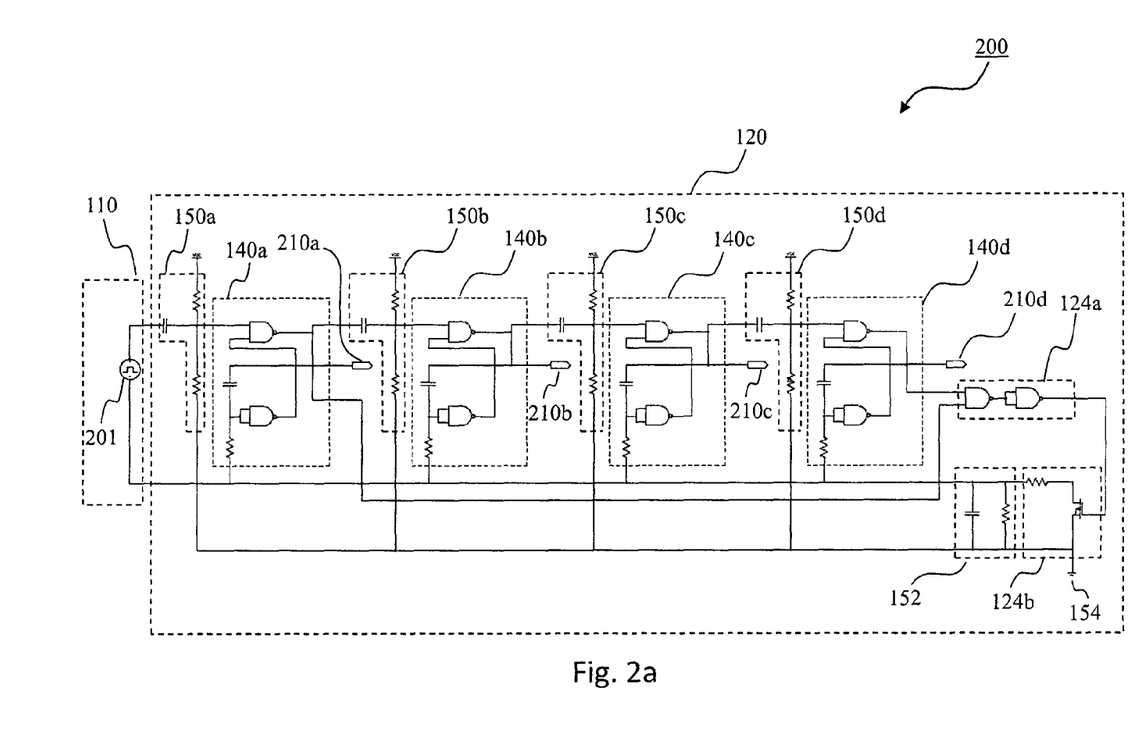
FIG. 2a to FIG. 2c show an exemplary implementation of the driver apparatus of FIG. 1a, according to an embodiment of the disclosure.
Figure 2B:
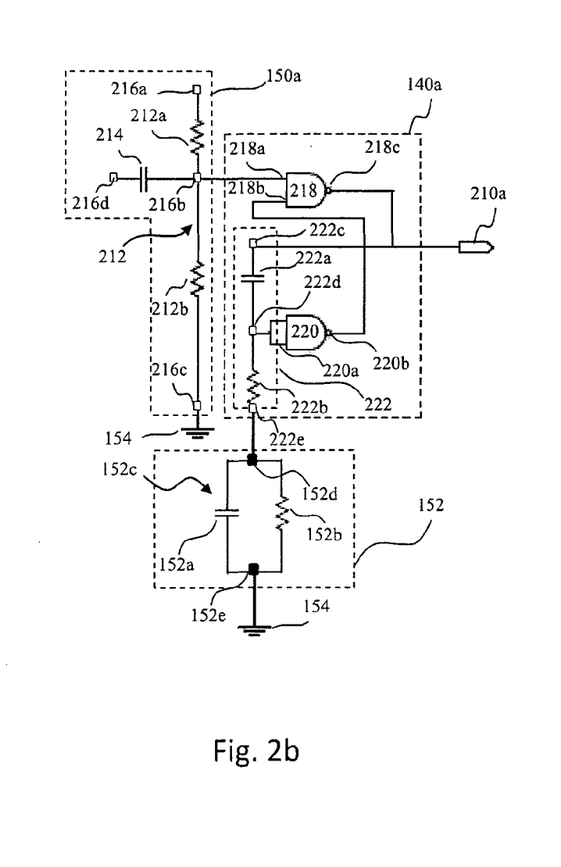
Figure 2C:
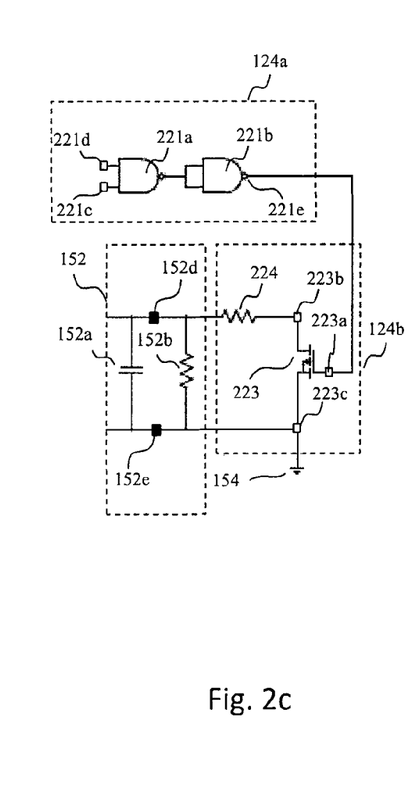

Referring to FIG. 2a to FIG. 2c, an exemplary implementation 200 of driver apparatus 120 is shown. FIG. 2a provides a general overview of the exemplary implementation 200. The processing portion 122 is discussed in further detail with reference to FIG. 2b. The control portion 124 is discussed in further detail with reference to FIG. 2c.

As shown in FIG. 2a, in the exemplary implementation 200, the input portion 110 can be a signal source 201 via which one or more input signals can be generated. Earlier mentioned, the one or more input signals can be communicated to the driver apparatus 120 for processing in a manner so as to produce drive signals. The drive signals can be communicated to the device 130 for driving the device 130.

Additionally, the processing segment array 140 can be a monostable multi-vibrator array. The monostable multi-vibrator array can include a plurality of connector ports via which the drive signals can be communicated to the device 130. The plurality of connector ports can include a first connector port 210a, a second connector port 210b, a third connector port 210c and a fourth connector port 210d.

The first and third connector ports 210a/210c can be coupled (not shown) to the first channel 130a via the first set of input ports 160a. In this manner, the first and third drive signals can be communicated to the first channel 130a of the device 130. The second and fourth connector ports 210b/210d can be coupled (not shown) to the second channel 130b via the second set of input ports 160b. In this manner, the second and fourth drive signals can be communicated to the second channel 130b of the device 130.

As mentioned above, the processing segment array 140 can be a monostable multi-vibrator array. In this regard, each processing segment of the plurality of processing segments can be a monostable multi-vibrator module. Specifically, each of the first to fourth processing segments 140a/140b/140c/140d can be a monostable multi-vibrator module which will be discussed in further detail with reference to FIG. 2b. More specifically, each of the first to fourth processing segments 140a/140b/140c/140d can be a monostable multi-vibrator module which is edge triggered. For example, each of the first to fourth processing segments 140a/140b/140c/140d can be a negative edge triggered monostable multi-vibrator module.

In general, each of the aforementioned monostable multi-vibrator modules can switch between a stable state and an unstable state based on the edge trigger. As shown, the first to fourth processing segments 140a/140b/140c/140d can be generally arranged in a cascading manner. Thus the first to fourth processing segments 140a/140b/140c/140d can each switch between a stable state and an unstable state in a sequential manner. Specifically, the first processing segment 140a can be switched between a stable state and an unstable state, followed by the second processing segment 140b which is in turn followed by the third processing segment 140c, and so on.

In this regard, each of the one or more input signals and first to third drive signals can be associated with a triggering edge which can be used to edge trigger respective first to fourth processing segments 140a/140b/140c/140d, as will be discussed in further detail with respect to an exemplary operation of the drive system 100, with reference to FIG. 3.

Additionally, in the exemplary implementation 200, each coupler segment of the coupler array 150 can be a circuit module. More specifically, each of the first to fourth coupler segments 150a/150b/150c/150d can be a circuit module, which will also be discussed in further detail with reference to FIG. 2b, having one or both of passive and active circuit elements. Moreover, the ground potential coupler 152, as will also be discussed in further detail with reference to FIG. 2b, can be a circuit arrangement having one or both of passive and active circuit elements.

Furthermore, in the exemplary implementation 200, the detection portion 124a can be a logic gate arrangement and the output portion 124b can be a switching arrangement as will be further discussed in further detail with reference to FIG. 2c.

Earlier mentioned, each of the first to fourth processing segments 140a/140b/140c/140d can be a monostable multi-vibrator module and each of the first to fourth coupler segments 150a/150b/150c/150d can be a circuit module, as will be discussed hereinafter with reference to FIG. 2b.

Referring to FIG. 2b, the first coupler segment 150a, as mentioned earlier, can be a circuit module having one or both of passive and active circuit elements. The first coupling segment 150a can, for example be a circuit module having passive circuit elements. Specifically, the first coupling segment 150a can include a potential divider arrangement 212 and a coupling element 214. The potential divider arrangement 212 can be configured in a manner such that the first coupler segment 150a can include a first connection point 216a, a second connection point 216b and a third connection point 216c. Additionally, the coupling element 214 can be coupled to the potential divider arrangement 212 in a manner such that the first coupler segment 150a can further include a fourth connection point 216d.

The potential divider arrangement 212 can, for example, include a first resistive element 212a and a second resistive element 212b. The first resistive element 212a can be coupled in series to the second resistive element 212b. The first and second resistive elements 212a/212b can each be, for example, a resistor and can each be associated with a resistance value. Additionally, the first and second resistive elements 212a/212b can be coupled in a manner so as to form the first connection point 216a, the second connection point 216b and the third connection point 216c.

The potential divider arrangement 212 can be configured in a manner so as to provide an appropriate bias to the first processing segment 140a. For example, the potential divider arrangement 212 can be configured to provide an appropriate voltage bias, also referable to as DC bias, to the first processing segment 140a via the second connection point 216b. Specifically, the potential divider arrangement 212 can be coupled to a voltage source (not shown) at the first connection point 216a. The potential divider arrangement 212 can further be coupled to ground potential 154 at the third connection point 216c. The potential divider arrangement 212 can be coupled to the first processing segment 140a at the second connection point 216b. Appreciably, by appropriately varying resistance values of one or both of the first and second resistive elements 212a/212b, an appropriate DC bias can be provided to the first processing segment 140a via the second connection point 216b.

The coupling element 214 can, for example, be a charge storage element such as a capacitor associable with a capacitance and having a first end and a second end. The first end can be coupled, at the fourth connection point 216d, to the input portion 110 in a manner such that one or more input signals can be received therefrom. The second end can be coupled to the potential divider arrangement 212 at the second connection point 216b. Thus, the first coupler segment 150a can be configured to couple the signal source 201 and the first processing segment 140a via capacitive coupling.

Earlier mentioned, the input portion 110 can be a signal source 201 via which one or more input signals can be generated. An input signal from the input portion 110 can be received and processed by the first coupler segment 150a to produce a processed input signal.

An input signal can be associated with one or more parameters which can include DC bias and signal frequency.

In this regard, the coupling element 214 can be configured to isolate DC bias associable with an input signal and the DC bias provided to the first processing segment 140a. For example, where the coupling element 214 is a capacitor, capacitance of the coupling element 214 can be appropriately selected in a manner so as to provide the aforementioned DC bias isolation whilst not adversely affecting signal frequency associated with an input signal. In this manner, an input signal communicated from the input portion 110 can be processed by the first coupler segment 150a in a manner such that the input signal can be DC biased via the potential divider arrangement 212. Hence the aforementioned processed input signal can correspond to an input signal which is DC biased via the potential divider arrangement 212.

In the above manner, the first coupler segment 150a can be configured to receive at least one input signal from the input portion 110 for processing in a manner so as to produce corresponding at least one processed input signal which can in turn be communicated to the first processing segment 140a for further processing to produce a first drive signal.

Referring further to FIG. 2b, the first processing segment 140a can be a monostable multi-vibrator module which can include a first logic gate 218 and a second logic gate 220. The first and second logic gates 218/220 can each, for example, be a NAND type logic gate. The first logic gate 218 can include a first input 218a, a second input 218b and an output 218c. The second logic gate 220 can include an input 220a and an output 220b. The monostable multi-vibrator module can further include a timer circuit 222. The timer circuit 222 can, for example, include a charge storage element 222a such as a capacitor and a resistive element 222b such as a resistor. The timer circuit 222 can further include a first contact point 222c, a second contact point 222d and a third contact point 222e.

As shown, the first input 218a of the first logic gate 218 can be coupled to the potential divider arrangement 212 at the second connection point 216b in a manner so as to receive a processed input signal. The second input 218b of the first logic gate 218 can be coupled to the output 220b of the second logic gate 220. The output 218c of the first logic gate 218 can be coupled to the first connector port 210a and the timer circuit 222. The timer circuit 222 can be coupled to the input 220a of the second logic gate 220. The timer circuit 222 can be further coupled to the ground potential coupler 152.

Specifically, the charge storage and resistive elements 222a/222b can be coupled to each other in a series arrangement in a manner such that the first, second and third contact points 222c/222d/222e are formed. More specifically, the output 218c of the first logic gate 218 can be coupled to the timer circuit 222 at the first contact point 222c. The input 220a of the second logic gate 220 can be coupled to the timer circuit 222 at the second contact point 222d. Additionally, the timer circuit 222 can be coupled to the ground potential coupler 152 at the third contact point 222e.

The ground potential coupler 152 can include one or both of passive and active circuit elements. For example, the ground potential coupler 152 can include a plurality of passive circuit elements such as a charge storage element 152a and a resistive element 152b. As shown, the charge storage and resistive elements 152a/152b can be coupled together in a parallel circuit arrangement 152c having a first end 152d and a second end 152e. The first end 152d of the parallel circuit arrangement 152c can be coupled to the timer circuit 222 at the third contact point 222e. The second end 152e of the parallel circuit arrangement 152c can be coupled to ground potential 154.

The first drive signal can be communicated from the output 218c of the first logic gate 218. More specifically, the first drive signal can, as earlier mentioned, be communicated to the device 130 and the second coupler segment 150b. The second coupler segment 150b and the second processing segment 140b are analogous to the first coupler segment 150a and the first processing segment 140a respectively.

The first drive signal can be received and processed by the second coupler segment 150b to produce a processed first drive signal which can be further communicated to the second processing segment 150b for further processing to produce the second drive signal. In this regard, the foregoing pertaining to the manner in which the first drive signal is produced based on the first coupler segment 150a and the first processing segment 140a, analogously applies.

Additionally, the third and fourth coupler segments 150c/150d are also analogous to the first coupler segment 150a. The third and fourth processing segments 140c/140d are also analogous to the first processing segment 140a. The second drive signal can be received and processed by the third coupler segment 150c to produce a processed second drive signal which can be communicated to the third processing segment 140c for further processing to produce the third drive signal. The third drive signal can be received and processed by the fourth coupler segment 150d to produce a processed third drive signal which can be communicated to the fourth processing segment 140d to produce the fourth drive signal. In this regard, the foregoing pertaining to the manner in which the first drive signal is produced based on the first coupler segment 150a and the first processing segment 140a, analogously applies.

Referring to FIG. 2c, the detection portion 124a can be a logic gate arrangement which includes a first logic gate 221a and a second logic gate 221b. The first logic gate 221a can be coupled to the second logic gate 221b in a cascading manner such that the logic gate arrangement includes a first input 221c, a second input 221d and an output 221e. The first and second logic gates 221a/221b can each, for example, be a NAND type logic gate.

The logic gate arrangement can be configured to receive a portion of the drive signals via the first and second inputs 221c/221d. The drive signals received at the first and second inputs 221c/221d can be processed by the logic gate arrangement in a manner so as to produce the control signal. The control signal can be communicated from the logic gate arrangement via the output 221e.

For example, the first and fourth drive signals can be received by the logic gate arrangement via the first and second inputs 221c/221d respectively. The logic gate arrangement can process the first and fourth drive signals in a manner so as to produce the control signal which can be communicated from the output 221e of the logic gate arrangement.

The logic gate arrangement can be coupled to the output portion 124b at the output 221e of the logic gate arrangement. In this manner, the control signal can be communicated from the detection portion 124a to the output portion 124b.

The output portion 124b can be a switching arrangement which includes one or both of an active element 223 and a passive element 224. The passive element 224 can be coupled to the active element 223 which can be switched between a saturation/an active operating mode (i.e., logical "on" or closed switch mode) and a cut-off operating mode (i.e., logical "off" or open switch mode).

The active element 223 can, for example, be a transistor such as a Metal Oxide Semiconductor Field Effect Transistor (MOSFET) or a Bipolar Junction Transistor (BJT). In one example, where the active element 223 is a N-Channel MOSFET, the active element 223 can include a first terminal 223a, a second terminal 223b and a third terminal 223c corresponding to the gate, drain and source terminals respectively of the N-channel MOSFET.

The passive element 224 can be a resistive type element such as a resistor having a first end and a second end.

The active element 223 can be coupled, at the first terminal 223a, to the output 221e of the logic gate arrangement in a manner so as to receive the control signal therefrom. The active element 223 can be further coupled, at the second terminal 223b, to the first end of passive element 224. The active element 223 can yet be further coupled, at the third terminal 223c, to the ground potential 154. Additionally, the second end of the passive element 224 can be coupled to the first end 152d of the ground potential coupler 152.

Based on the control signal communicated to the output portion 124b, the active element 223 of the output portion 124b can be operated in one of the active operating mode and the cut-off operating mode.

When the active element 223 of the output portion 124b is operating in the saturation/active operating mode, the first end of the passive element 224 can be effectively coupled to ground potential 154. Thus the charge storage and resistive elements 152a/152b of the ground potential coupler 152 which are coupled together in a parallel circuit arrangement 152c, can be further coupled to the passive element 224 of the output portion 124b in another parallel circuit arrangement. Specifically, the resistive and passive elements 152b/224 can be coupled in parallel in a manner so as to form an effective resistor having an effective resistance of lower resistance value compared to that of the resistive element 152b. The charge storage element 152a can thus discharge via the effective resistor.

When the active element 223 of the output portion 124b is operating in the cut-off operating mode, the first end of the passive element 224 can effectively be isolated from ground potential 154. Thus the charge storage element 152a can discharge via the resistive element 152b.

Thus based on the control signal communicated to the output portion 124b, it is appreciable that variance of the effective reference potential with respect to the reference potential can be controlled.

Further appreciably, the manner in which the processing portion 122 produces the drive signals can, in turn, be controlled based on control of variance of the effective reference potential. Specifically, in this manner, the drive signals produced by the processing portion 122 can be substantially synchronized with the one or more input signals.

In a first exemplary scenario, an input signal can be associated with a repetition rate of 50 Hz and in a second exemplary scenario an input signal can be associated with a repetition rate of 60 Hz. It is appreciable that as the drive signals can be substantially synchronized with the one or more input signals, signal integrity of the drive signals produced by the processing portion 122 can substantially be preserved regardless the repetition rate of the input signal. Particularly, as the drive signals can be substantially synchronized with the one or more input signals, the processing portion 122 can be capable of reliably producing drive signals regardless whether the input signal is associated with a repetition rate of 50 Hz, as in the first exemplary scenario, or a repetition rate of 60 Hz, as in the second exemplary scenario.

Thus the control portion 124, which facilitates the substantial synchronization of the drive signals to the one or more input signals, is capable of facilitating flexibility/adaptability of the processing portion 122 in processing input signals associated with various repetition rates such that the processing portion 122 can reliably produce drive signals regardless the repetition rate associated with an input signal.

An exemplary operation of the drive system 100 will be discussed hereinafter with reference to FIG. 3a to FIG. 3h.

Figure 3A:
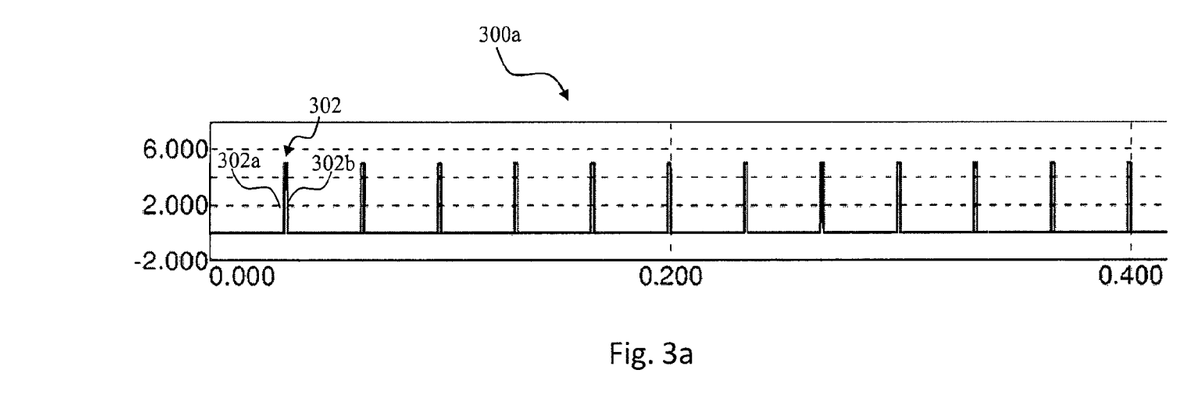
FIG. 3a to FIG. 3h illustrate an exemplary operation of the drive system of FIG. 1a, in accordance with an embodiment of the disclosure.
Figure 3B:
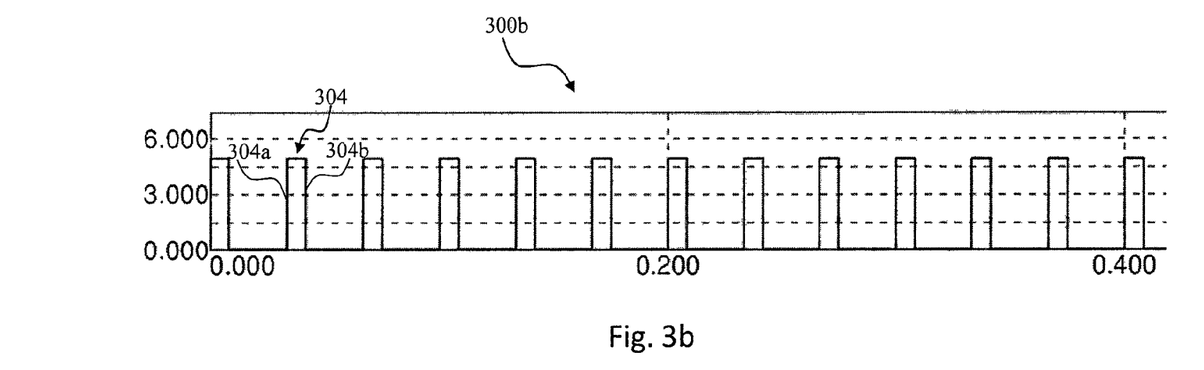
Figure 3C:
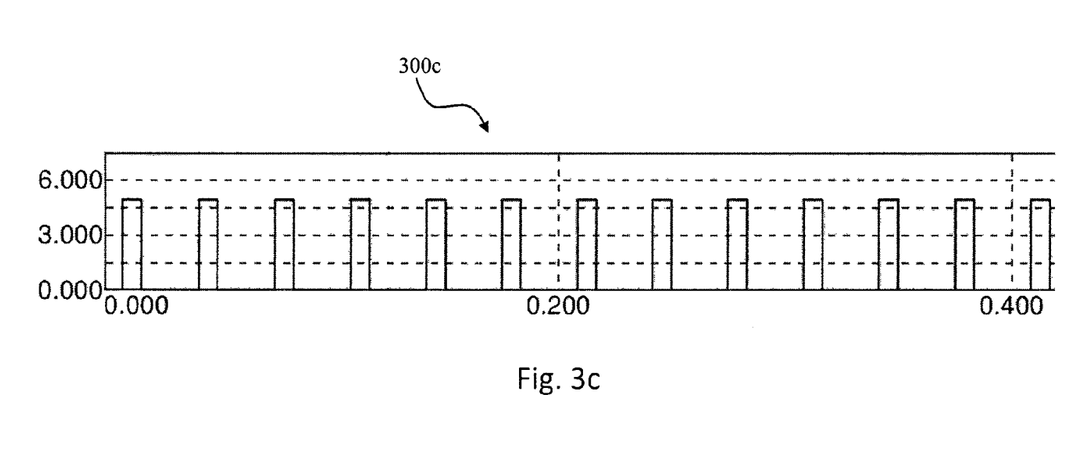
Figure 3D:
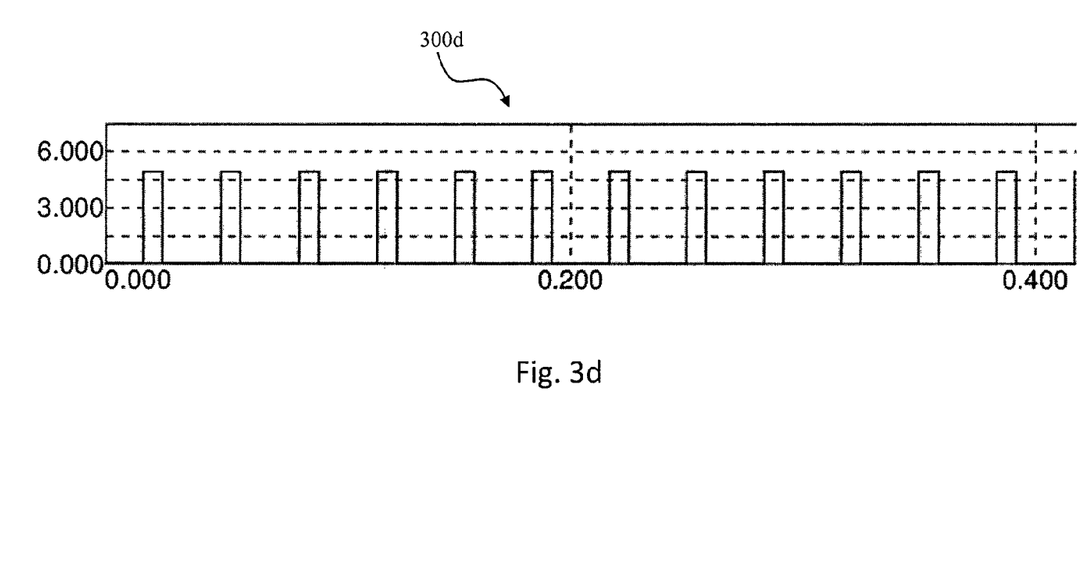
Figure 3E:
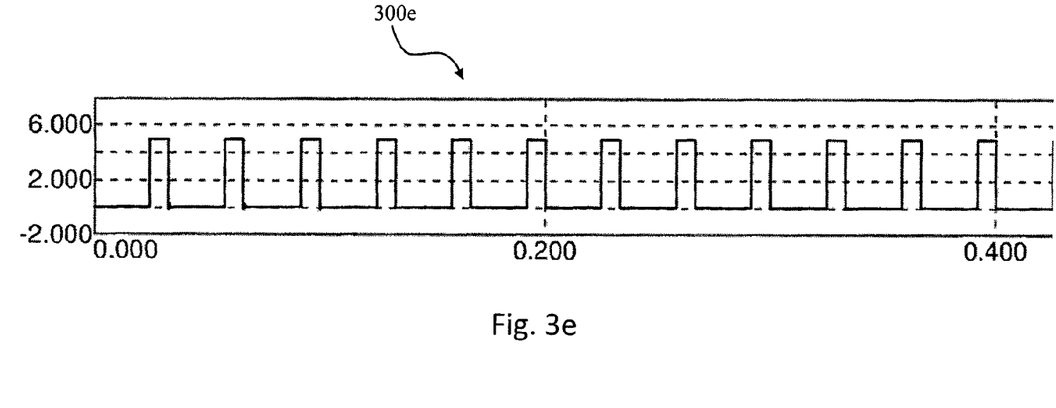
Figure 3F:
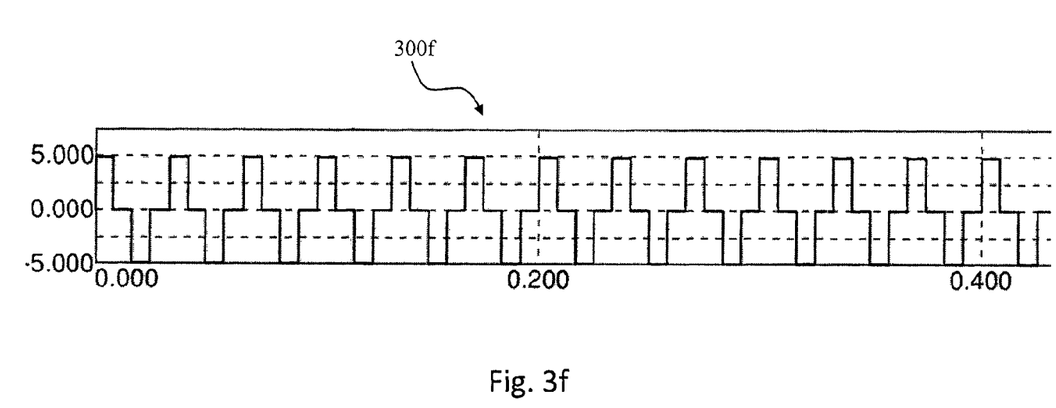
Figure 3G:
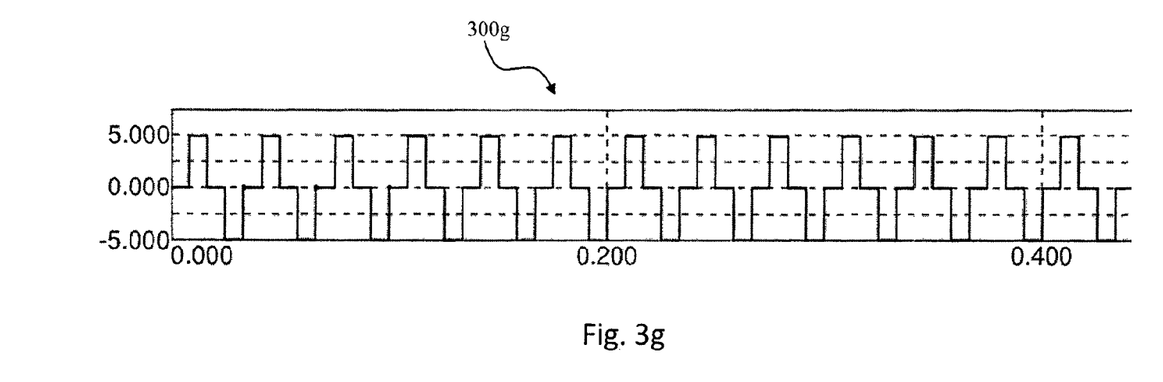
Figure 3H:
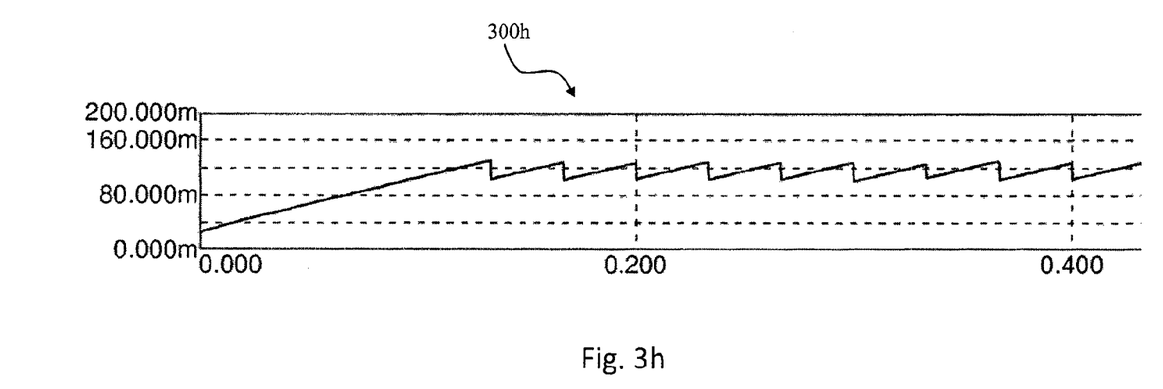

FIG. 3a shows an exemplary input signal which can be communicated from the input portion 110 to the first processing segment 140a, in accordance with an embodiment of the disclosure. FIG. 3b shows an exemplary first drive signal communicable from the first processing segment 140a, in accordance with an embodiment of the disclosure. FIG. 3c shows an exemplary second drive signal communicable from the second processing segment 140b, in accordance with an embodiment of the disclosure. FIG. 3d shows an exemplary third drive signal communicable from the third processing segment 140c, in accordance with an embodiment of the disclosure. FIG. 3e shows an exemplary fourth drive signal communicable from the fourth processing segment 140d, in accordance with an embodiment of the disclosure. FIG. 3f shows an exemplary first composite driving signal, in accordance with an embodiment of the disclosure. FIG. 3g shows an exemplary second composite driving signal, in accordance with an embodiment of the disclosure. FIG. 3h shows an exemplary reference potential signal which can be observed at the first end 152d of the ground potential coupler 152, according to an embodiment of the disclosure.

Referring to FIG. 3a, the exemplary input signal can be an input pulse train 300a which includes a plurality of pulses. Specifically, the input pulse train 300a can include at least a first input pulse 302 which can be associated with a raising edge 302a and a falling edge 302b. The falling edge 302b can correspond to the aforementioned negative edge.

Referring to FIG. 3b, the exemplary first drive signal can be a first driving pulse train 300b which includes a plurality of pulses. Specifically, the first driving pulse train 300b can include a first driving pulse 304 which can be associated with a raising edge 304a and a falling edge 304b. The falling edge 304b can correspond to the aforementioned negative edge.

Based on the input pulse train 300a, the first processing segment 140a can be configured to produce the first driving pulse train 300b. Specifically, as mentioned earlier, the first processing segment 140a can, for example, be a negative edge triggered monostable multi-vibrator module. In this regard, the first driving pulse 304 can be triggered by the first input pulse 302. Specifically, the first driving pulse 304 can be triggered by the falling edge 302b of the first input pulse 302. More specifically, the raising edge 304a of the first driving pulse 304 substantially coincides with the falling edge 302b of the first input pulse 302.

Additionally, based on the first driving pulse train 300b, the second processing segment 140b can be configured to produce the exemplary second drive signal in a manner analogous to the production of the first driving pulse train 300b based on the input pulse train 300a. In this regard, the foregoing pertaining to the production of the first driving pulse train 300b, where appropriate, analogously applies. As shown in FIG. 3c, the exemplary second drive signal can be a second driving pulse train 300c.

Based on the second driving pulse train 300c, the third processing segment 140c can be configured to produce the exemplary third drive signal in a manner analogous to the production of the first driving pulse train 300b based on the input pulse train 300a. In this regard, the foregoing pertaining to the production of the first driving pulse train 300b, where appropriate, analogously applies. As shown in FIG. 3d, the exemplary third drive signal can be a third driving pulse train 300d.

Based on the third driving pulse train 300d, the fourth processing segment 140c can be configured to produce the exemplary fourth drive signal in a manner analogous to the production of the first driving pulse train 300b based on the input pulse train 300a. In this regard, the foregoing pertaining to the production of the first driving pulse train 300b, where appropriate, analogously applies. As shown in FIG. 3e, the exemplary fourth drive signal can be a fourth driving pulse train 300e.

Moreover, based on the first driving pulse train 300b and the third driving pulse train 300d, a first resultant drive signal 300f as shown in FIG. 3f can be produced. The first resultant drive signal 300f can correspond to the aforementioned first composite driving signal.

Based in the second driving pulse train 300c and the fourth driving pulse train 300e, a second resultant drive signal 300g as shown in FIG. 3g can be produced. The second resultant drive signal 300g can correspond to the aforementioned second composite driving signal.

Referring to FIG. 3h, the exemplary reference potential signal can be a sawtooth type signal 300h.

Figure 4:
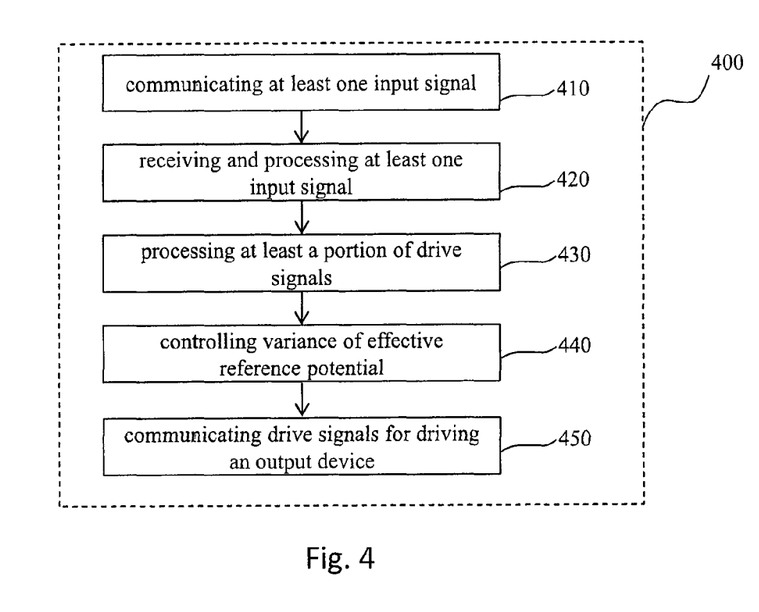
FIG. 4 is a flow diagram illustrating a signal processing method which can be implemented in association with the drive system of FIG. 1a, in accordance with an embodiment of the disclosure.

Referring to FIG. 4, a signal processing method 400 can be implemented in association with the drive system 100.

The signal processing method 400 can include communicating at least one input signal 410. Specifically, one or more input signals can be communicated from the input portion 110 to the processing portion 122.

The signal processing method 400 can also include receiving and processing at least one input signal 420. Particularly, one or more input signals can be received and processed by the processing portion 122 in a manner so as to produce drive signals.

Additionally, the signal processing method 400 can further include processing at least a portion of drive signals 430. Particularly, at least a portion of the drive signals can be further communicated to the detection portion 124a for further processing in a manner so as to produce the control signal.

Furthermore, the signal processing method 400 can include controlling variance of effective reference potential 440. Particularly, based on the control signal, the output portion 124b can be configured to control variance of the effective reference potential with respect to the reference potential in a manner as discussed with reference to FIG. 2 so as to control the manner in which the processing portion 122 produces the drive signals.

The signal processing method 400 can optionally include communicating drive signals for driving an output device 450. In particular, the drive signals can be communicated from the processing portion 122 to the device 130 for driving the device 130.

In the foregoing manner, various embodiments of the disclosure are described for addressing at least one of the foregoing disadvantages. Such embodiments are intended to be encompassed by the following claims, and are not to be limited to specific forms or arrangements of parts so described and it will be apparent to one skilled in the art in view of this disclosure that numerous changes and/or modification can be made, which are also intended to be encompassed by the following claims.

The invention claimed is:

1. A driver apparatus configurable for receiving and processing at least one input signal, the driver apparatus being coupleable to ground potential, the driver apparatus comprising:
  a processing portion configurable for receiving and processing the at least one input signal in a manner so as to produce drive signals, the processing portion comprising a processing segment array and the processing segment array comprises a plurality of processing segments, each of which being configurable to produce a drive signal;
  a ground potential coupler coupling at least a portion of the processing portion to the ground potential such that the processing portion is configurable to produce the drive signals based on an effective reference potential; and
  a control portion coupled to the processing portion and the ground potential coupler, the control portion being configurable to receive and process at least a portion of the drive signals in a manner so as to control variance of the effective reference potential, the control portion comprising:
    a detection portion; and
    an output portion which is coupled to the detection portion and the ground potential coupler,
    wherein the detection portion is coupled to the processing portion in a manner so as to receive and process at least a portion of the drive signals to produce a control signal, and
    wherein the control signal is communicable to the output portion such that variance of the effective reference potential is controllable.

2. The driver apparatus as in claim 1,
  wherein the plurality of processing segments comprises a first processing segment, a second processing segment, a third processing segment and a fourth processing segment,
  wherein the first processing segment is coupled to the second processing segment, the second processing segment is coupled to the third processing segment and the third processing segment is coupled to the fourth processing segment, and
  wherein the drive signals comprises a first drive signal, a second drive signal, a third drive signal and a fourth drive signal.

3. The driver apparatus as in claim 2,
wherein the first processing segment is configurable for receiving and processing at least one input signal to produce the first drive signal which is communicable from the first processing segment to the second processing segment,
wherein the second processing segment is configurable for producing the second drive signal based on the first drive signal, the second drive signal being communicable from the second processing segment to the third processing segment,
wherein the third processing segment is configurable for producing the third drive signal based on the second drive signal, the third drive signal being communicable from the third processing segment to the fourth processing segment, and
wherein the fourth processing segment is configurable for producing the fourth drive signal based on the third drive signal.

4. The driver apparatus as in claim 3,
wherein the processing segment array corresponds to a monostable multi-vibrator array, and
wherein each processing segment of the plurality of processing segments corresponds to a monostable multi-vibrator module which is edge triggered.

5. The driver apparatus as in claim 4 wherein each processing segment of the plurality of processing segments corresponds to a monostable multi-vibrator module which is negative edge triggered.

6. The driver apparatus as in claim 1, wherein variance of the effective reference potential is controllable such that the drive signals are capable of being synchronized with the at least one input signal.

7. The driver apparatus as in claim 1, the output portion being a switching arrangement operable in one of a saturation operating mode and a cut-off operating mode.

8. The driver apparatus as in claim 7, the output portion being switchable between the saturation operating mode and the cut-off operating mode based on the control signal.

9. The driver apparatus as in claim 8, the switching arrangement comprising an active element and a passive element which is coupled to the active element.

10. The driver apparatus as in claim 9, the ground potential coupler comprising:
a charge storage element; and
a resistive element,
wherein the charge and resistive elements are coupled in a parallel circuit arrangement.

11. The driver apparatus as in claim 10, wherein when the switching arrangement is operating in the saturation mode, the passive element is effectively coupled to the charge storage element and the resistive element in another parallel circuit arrangement.

12. The driver apparatus as in claim 9 wherein the active element is a transistor and the passive element is a resistive type element.

* * * * *